United States Patent [19]

Yokoyama et al.

[11] Patent Number: 4,796,354

[45] Date of Patent: Jan. 10, 1989

[54] METHOD OF MANUFACTURING A POSITION SENSOR FOR DETECTING ANGULAR POSITION

[75] Inventors: Toshio Yokoyama; Iwao Shimane; Tsuneo Konno, all of Saitama, Japan

[73] Assignee: Honda Giken Kogyo Kabushiki Kaisha, Tokyo, Japan

[21] Appl. No.: 27,832

[22] Filed: Mar. 19, 1987

[30] Foreign Application Priority Data

Mar. 19, 1986 [JP] Japan .................................. 61-63404

[51] Int. Cl.⁴ ............................................ H01F 41/02
[52] U.S. Cl. ........................................ 29/608; 29/598;
29/607; 123/146.5 A; 264/272.11; 264/275;
264/328.12; 310/43; 324/208
[58] Field of Search ............ 29/598, 607, 608, 602 R;
310/43; 264/275, 328.12, 272.11, 272.16,
272.19, 272.20; 123/617, 146.5 A; 324/208

[56] References Cited

U.S. PATENT DOCUMENTS

| | | | |
|---|---|---|---|
| 2,104,189 | 1/1938 | Cotterman | 264/272.19 |
| 2,488,729 | 11/1949 | Kooyman | 264/272.19 |
| 3,246,187 | 4/1966 | Iemura | 29/598 |
| 4,006,210 | 2/1977 | Denton | 264/328.12 |
| 4,173,822 | 11/1979 | Futterer | 29/596 |

Primary Examiner—Carl E. Hall
Attorney, Agent, or Firm—Lyon & Lyon

[57] ABSTRACT

A method of manufacturing an angle-of-rotation sensor comprises fabricating a rotating member by providing a shaft coaxially inside a magnetic ring made of ferrite magnetic material or the like, and filling the space between shaft and ring with resin. As the resin is first provided on the outer surface of the magnetic ring, then in the interior, a balance is achieved between tensile stress from within the ring and compressive stress from the outside of the ring, and as a result the ring is not broken or cracked. Thus, with this method it is possible to make the angle-of-rotation sensor small and light.

11 Claims, 7 Drawing Sheets

METHOD OF MANUFACTURING A POSITION SENSOR FOR DETECTING ANGULAR POSITION

BACKGROUND OF THE INVENTION

1. Field of the Invention

This invention relates to a method of manufacturing an angle-of-rotation sensor for detecting the angle of rotation of a shaft. This invention particularly relates to a method of manufacturing an angle-of-rotation sensor for detecting the angle of rotation of the crankshaft of an internal combustion engine of an automobile or other such vehicle.

2. Description of the Prior Art

Recently, electronic control technology for internal combustion engines has been making rapid progress. With respect to such electronic control, control timing is important and as such it is necessary to detect with precision piston crank angle positions for use as reference signals. Conventional types of angle-of-rotation sensors include, for example, the type disclosed in Japanese Laid-open Patent Publication No. 57(1982)-133311. In this conventional technology a rotating member is formed by stacking three disk-shaped magnets one on top of the other. Each of the magnets has magnetic poles formed contiguously around the periphery thereof, forming three arrays of magnetized zones.

However, because in this conventional type the rotating member is formed by the stacking of disk-shaped magnets, the rotating member becomes heavy, requiring that the diameter of the shaft be increased, with the result that other parts such as the bearings have had to be made large, so that overall the sensor becomes large and heavy, requiring a large space to house it in and causing a degradation in durability.

It is thereupon conceived that a magnetic member could be employed in place of the disk-shaped magnets, such as tubular magnetic ring formed of ferrite, for example, and a shaft arranged coaxially therein, and filling the space therebetween with resin. However, the brittle nature of ferrites is well known, in addition to which, when formed into a tubular shape, they are relatively weak to outward-acting tensile stress, and there is therefore a risk that if the tubular magnetic ring is filled rapidly with the resin, the said tensile stress would fracture or crack the magnetic ring. In addition, it is not necessarily easy to firmly fasten the magnetic ring to the shaft so that no slippage would occur therebetween.

SUMMARY OF THE INVENTION

An object of this invention is to provide a method of manufacturing an angle-of-rotation sensor which has a tubular magnetic ring of, for example, a ferrite magnet and is light and compact, can be contained in a small space and has good durability.

A further object of the present invention is to provide a method of manufacturing an angle-of-rotation sensor comprised of a light, compact magnetic member within which is a shaft coaxially fixed by means of resin, producing a strong bond between shaft, resin and magnetic member so that there is no slippage therebetween.

In order to achieve these objectives, the present invention provides a method of manufacturing an angle-of-rotation sensor comprising the fabrication of a magnetic rotating member by disposing a shaft inside a hollow tubular member coaxially thereto, injecting resin onto the other surface of the tubular member, then injecting resin into the interior of the tubular member to affix the shaft to the tubular member, and then forming magnetic poles on the outer surface of the tubular member.

BRIEF DESCRIPTION OF THE DRAWINGS

These and other objects and advantages of the present invention will be more apparent from the following description and drawings, in which:

FIGS. 4(*a*) to 4(*j*) are explanatory process views showing an embodiment of the method of manufacturing the angle-of-rotation sensor according to the present invention;

and

FIGS. 5(*a*) to 5(*d*) are explanatory process views showing a second embodiment of this invention.

DESCRIPTION OF THE PREFERRED EMBODIMENTS

The present invention will now be described with reference to the accompanying drawings.

Figure 1:
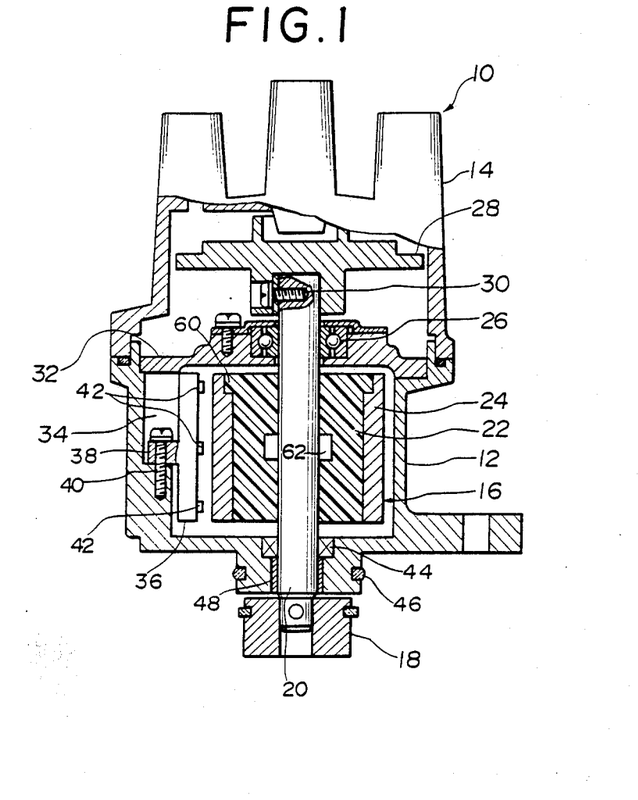
FIG. 1 is an explanatory cross-sectional view showing the angle-of-rotation sensor manufactured according to the method of the present invention, provided as an example inside a distributor.
Figure 2:
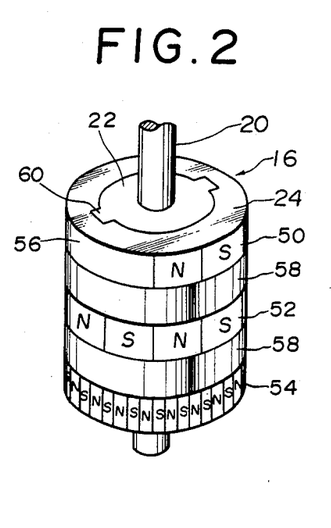
FIG. 2 is an explanatory perspective view of the rotating member of the angle-of-rotation sensor shown in FIG. 1.
Figure 3:
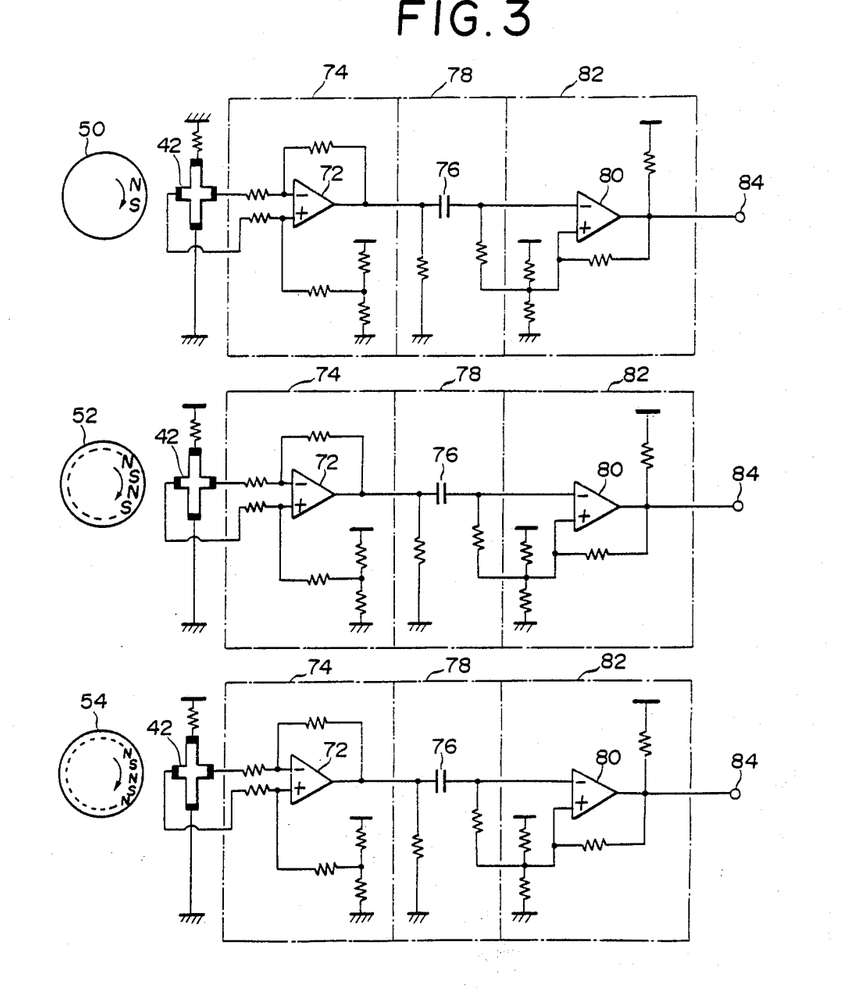
FIG. 3 is a block diagram of the detection circuit of the angle-of-rotation sensor shown in FIG. 1.

To understand the manufacturing method according to this invention, the construction of an angle-of-rotation sensor manufactured by this method will now be explained, with reference to FIGS. 1 to 3. An example of the angle-of-rotation sensor is shown provided within a distributor 10; a housing 12 and a distributor cap 14 that fit onto the upper part of the housing 12 form the casing of the distributor 10 within which a rotating member 16 is rotatably housed. The rotating member 16 comprises a shaft 20 which is coupled via a joint 18 to a camshaft (not shown) which rotates synchronously with the rotation of a crankshaft (not shown) of an internal combustion engine at one half the revolutions thereof, and a magnetic ring 24, described hereinbelow, which is affixed on said shaft 20 coaxially therewith by means of a thermosetting resin 22 such as a phenol resin or the like. The rotating member 16 is supported by a bearing 26 inside the distributor 10 so as to be freely rotatable, and has at the upper end thereof a motor 28 affixed thereto by a screw 30.

The magnetic ring 24 is rotatably located in a chamber 34 formed by a partition 32. A sensor board 36 in the chamber 34 which is separated from the outer peripheral surface of the magnetic ring 24 by a specific distance is fixed to the housing 12 by means of a bracket 38 and screws 40. The sensor board 36 is provided with three Hall elements 42 that act as the magneto electric transducer means, the Hall elements 42 being arranged in opposition to magnetized zones formed on the magnetic ring. Although in this embodiment Hall elements are used for the magneto electric transducer means, it is to be understood that it would be precisely the same if magneto resistors or the like were used. The numeral 44 denotes an oil seal, 46 an O-ring and 48 a bearing metal.

The rotating member 16 will now be described in further detail with reference to FIG. 2. The magnetic ring 24 which forms the rotating member 16 is tubular in shape, as shown, and has formed on the periphery thereof, in the direction of the axis of rotation of the magnetic ring 24, a plurality of magnetized zones. In the diagram, there are three such zones, a first magnetized zone 50, a second magnetized zone 52 and a third magnetized zone 54. On the circumference of these magnetized zones 50, 52 and 54 are formed an appropriate number of magnetic poles consisting of N poles and S poles. Assuming that the angle-of-rotation sensor according to the present invention is fitted to a 4-cylinder internal combustion engine, the first magnetized zone 50 will have one pair of poles, the second magnetized zone 52 will have four pairs of poles and the third magnetized zone 54 will have twenty-four pairs of poles (for ease of understanding the third magnetized zone is shown with fewer magnetic poles). As the first magnetized zone 50 has only one pair of magnetic poles, the remaining part has been made a non-magnetized portion 56. Non-magnetized zones 58, 58 are interposed between the magnetized zones 50, 52 and 54; the presence of the non-magnetized zones preventing mutual magnetic interference between the magnetized zones 50, 52 and 54. Also the width of each of the magnetized zones 50, 52 and 54 in the direction of the axis of rotation is made greater than the width of the magneto-sensitive surface of the Hall elements 42, alleviating the complexity of the positioning task. The magnetic ring 24 has insets 60 formed therein into which the resin 22 flows, increasing the strength of the bond between the magnetic ring 24 and the resin 22, in addition to which a key 62 (FIG. 1) is inset into the shaft 20 so that a portion of the key 62 projects out from the shaft 20, to form a strong joint between the resin 22 and the shaft 20.

The functioning of the angle-of-rotation sensor according to the present invention will now be explained hereinbelow, with reference to FIG. 3. A sensor board 36 that is provided in the proximity of the rotating member 16 that rotates one-half revolution for every one revolution of an internal combustion engine crankshaft (not shown) is provided thereon with three Hall elements 42 in which an electric voltage is produced upon being subjected to the magnetic fields of the magnetized zones 50, 52 and 54 of the magnetic ring 24, these outputs each being passed through an amplification circuit 74 that is provided with a differential amplifier 72, a direct current component filter circuit 78 provided with a coupling capacitor 76, and a comparator circuit 82 provided with a comparator 80, and is taken off via output terminals 84 and transmitted to an afterprocessing circuit (not shown). One pulse is obtained from the first magnetized zone 50 per crank revolution of 720 degrees for use as a cylinder discrimination signal, one pulse is obtained from the second magnetized zone 52 per crank revolution of 180 degrees for use as a piston TDC position signal, and one pulse is obtained from the third magnetized zone 54 per crank revolution of 30 degrees for use as a unit angle signal, and on the basis of these angle signals the internal combustion engine (not shown) may be controlled with good precision.

Figure 4A:
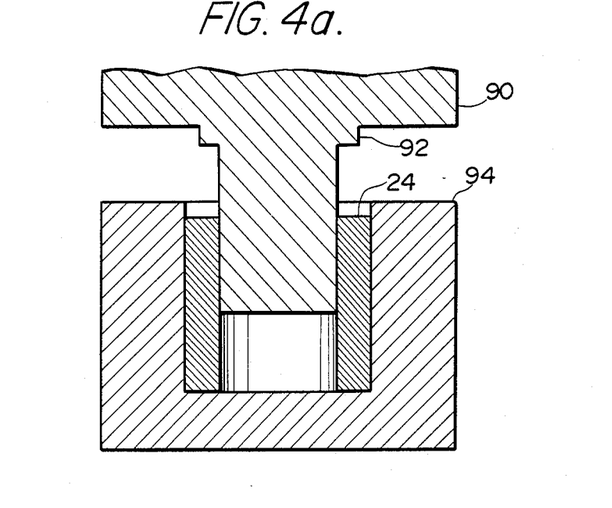
Figure 4B:
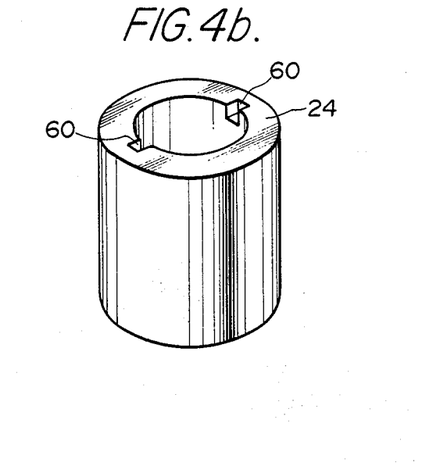

The method of manufacturing the angle-of-rotation sensor according to this invention will now be described, with reference to FIGS. 4(a) to 4(j). A ferrite magnetic ring 24 which has not yet been magnetized is press-formed as shown in FIG. 4(a). By forming projections 92 on a press ram 90 the molded magnetic ring 24 is provided with two insets 60 (FIG. 4(b)). These insets 60 are formed only at one end of the magnetic ring, the other end being left flat to facilitate removal of the magnetic ring from a mold 94.

Figure 4C:
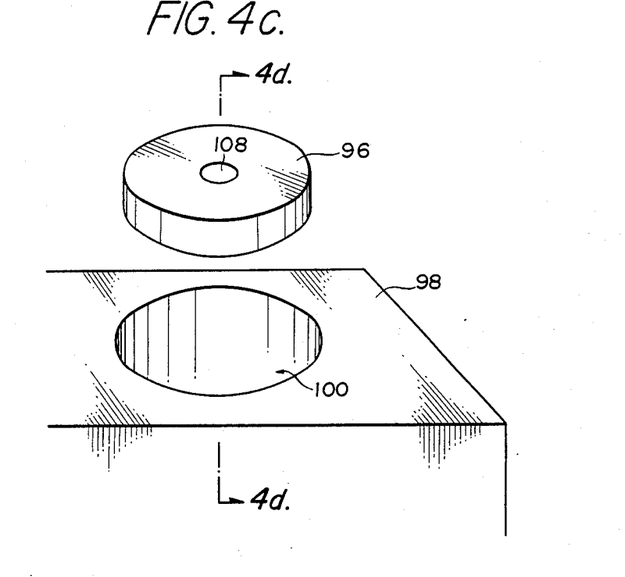
Figure 4D:
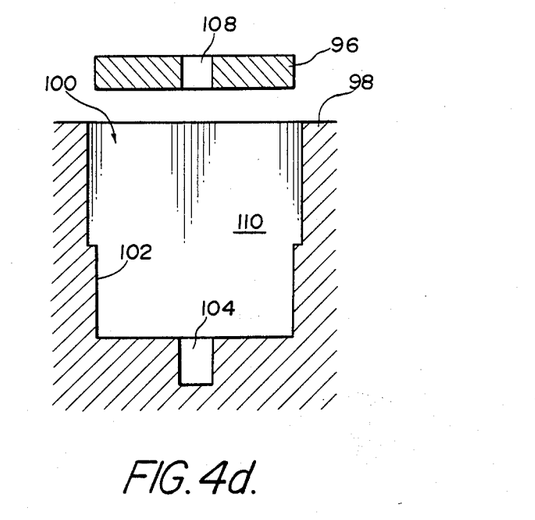
Figure 4E:
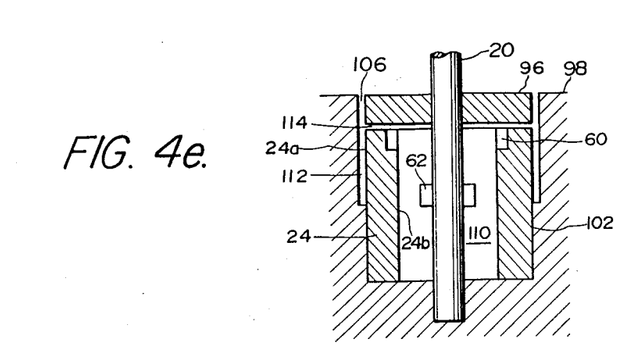

An upper die half 96 and a lower die half 98 are prepared (FIGS. 4(c) and 4(d)). A hole 100 is provided in the center portion of the lower die half 98. The hole is provided with a stepped portion 102 around its inner wall and a small hole 104 formed in its bottom face for the insertion of the shaft 20 of the rotating member 16. The outer diameter of the upper die half 96 is made slightly smaller than the inner diameter of the hole 100 to allow a circular inlet 106 (FIG. 4(e)) to be formed between the die halves when the upper die half is fitted into position. A hole 108 is provided in the central portion of the upper die half 96 to receive the shaft 20.

Next, the ferrite magnetic ring 24 which has not yet been magnetized is positioned in the lower die half 98 and the shaft 20 is positioned coaxially to the magnetic ring 24 in the inner space 110 thereof, in which state the magnetic ring 24 is housed in contact with the stepped portion 102. Therefore, a circular first passage 112 is formed which is a perpendicular continuation of the inlet 106. The upper die half 96 is then placed in the hole 100 and by means of a support means (not shown) is positioned a prescribed distance from the upper part of the magnetic ring 24. In this state, therefore, a diskshaped second passage 114 is formed that extends horizontally from partway down the inlet 106, said second passage 114 being in communication with the internal space 110 of the magnetic ring 24.

Figure 4F:
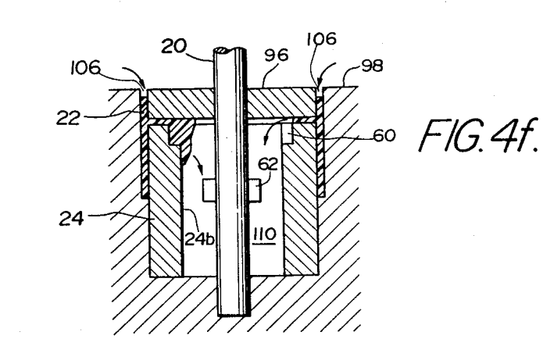

Molten resin 22 which has been heated to a temperature of 200° C. or more is then run in via the inlet 106, as indicated by the arrow in FIG. 4(f). Any thermosetting resin may be used, such as for example phenol resin. Because the inlet 106 leads perpendicularly straight into the first passage 112, the resin 22 first penetrates into and fills the first passage 112, and when the level of the resin in the first passage 112 reaches the level of the junction with the second passage 114, it penetrates into the second passage 114 and thence into the space 110 in the magnetic ring 24. As in this case inward-acting compressive stress is being exerted on the magnetic ring 24 by the resin that fills the first passage 112, any outward-acting tensile stress exerted on the magnetic ring 24 by resin penetrating into the interior space 110 is contained by the compressive force. As the inner and outer forces thus balance each other out, the magnetic ring 24 can be filled without any risk that it will be broken or cracked by being subjected to excess tensile stress. Also, by selecting as the resin 22 a resin that has the same coefficient of thermal expansion as the magnetic ring 24 and good heat- and shock-resistance, for example those containing glass fiber, such as unsaturated polyester resin, phenol resin, melamine resin, polyester alkyd resin, allylic rdsin, silicone resin, epoxy resin or polyamide resin, the changes in volume that take place during thermal expansion can be absorbed, thereby further ensuring that no breaks or cracks are produced.

The integrity can be further enhanced by using a resin which possesses adhesiveness and which does not lose its resilience after it has set, such as for example epoxy resin, phenolic novolak epoxy resin, cyclic fatty acid epoxy resin, ortho cresole novolak epoxy resin, polyester alkyl resin or polyamide resin. Use of such a resin provides further advantages, such as that should breakage occur it will not result in pieces flying around, and because of its vibration-resistance, it would eliminate any output error that might otherwise occur during application in the distributor 10.

Figure 4G:
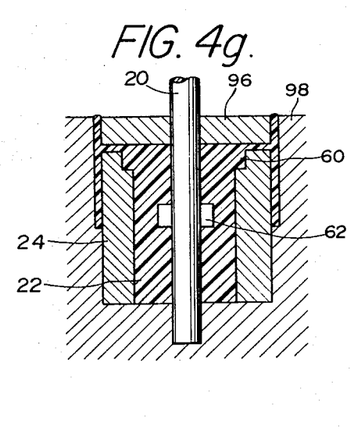

After the charging of the resin 22 has been completed, it is left to cool for a prescribed length of time, allowing the resin 22 to set, bonding the magnetic ring 24 to the output shaft 20 (FIG. 4(g)).

Figures 4H, 4I:
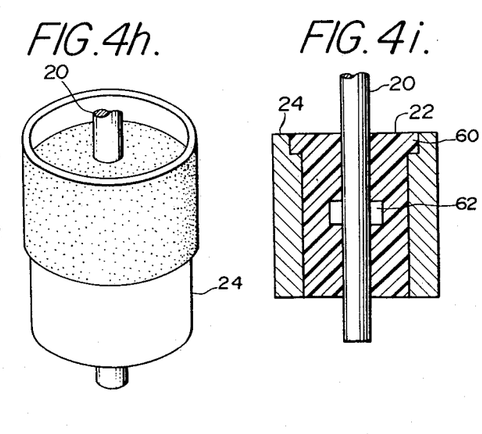
Figure 4J:
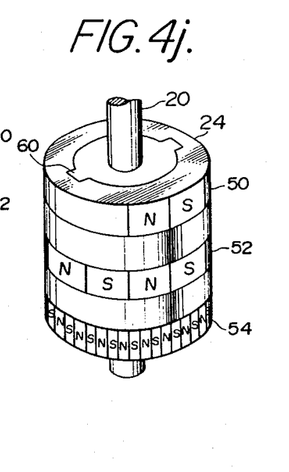
Figure 5A:
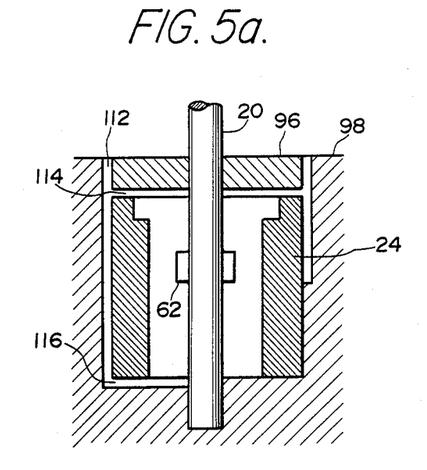
Figure 5B:
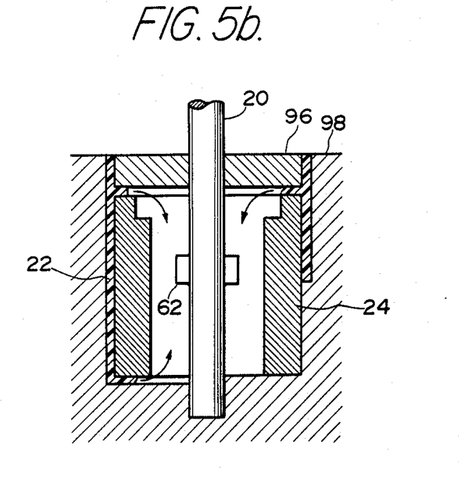
Figure 5C:
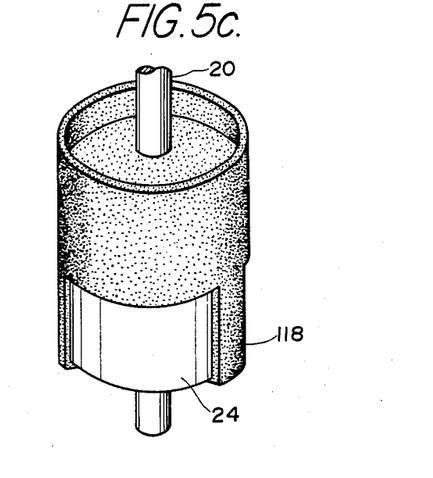
Figure 5D:
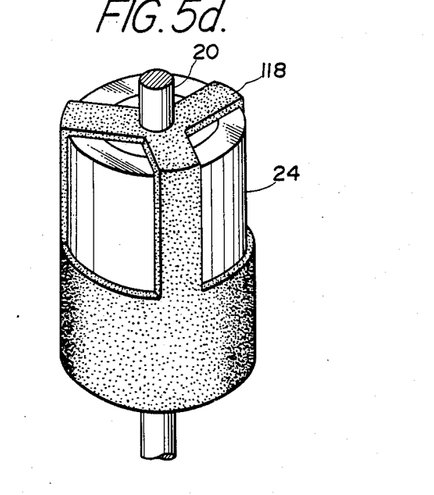

After removing the member from the die halves 96 and 98 and machining off resin adhering to the first passage 112 and the second passage 114 with the use of a lathe or the like (FIGS. 4(h) and 4(i)), the rotating member is completed by forming the magnetized zones 50, 52 and 54 and the non-magnetized zones 58 on the magnetic ring 24 (FIG. 4(j)).

The penetration of the resin 22 into the insets 60 and its total encirclement of the shaft 20 from which protrudes the key 62 provides a strong bond between the shaft 20 and the magnetic ring 24 that prevents any slipping therebetween. The angle-of-rotation sensor is finally completed by arranging the rotating member 24 inside the distributor 10 in opposition to the magneto electric transducer means 42.

Although in the above example ferrite magnet is the material used for the magnetic ring 24, other materials may be used, such as barium, magnetic alloy, alnico, cobalt, rare-earth alloys, or plastic magnets formed by dispersing particles of the above in plastic bar.

FIG. 5 shows an another embodiment of the manufacturing method according to this invention, in which the cylindrical first passage 112 of the first embodiment is extended at three points to form a third passage 116 of a prescribed width arranged around the lower portion of the magnetic ring 24 at intervals of 120 degrees. As a result, when removed from the die halves 96 and 98 the resin adheres to the magnetic ring 24 as shown in FIG. 5(c). As shown more clearly in FIG. 5(d), where it is shown upside down, the lower portion of the magnetic ring 24 has strip portions 118 at intervals of 120 degrees. Therefore, when the interior is being charged with the resin, the balancing of the inward and outward stresses is enhanced because the compressive stress action of the resin can now be extended to portions of the lower half of the ring, providing further assurance against breakage or cracking.

Although in the foregoing the method of manufacturing the angle-of-rotation sensor according to this invention has been described with reference to the sensor used in an internal combustion engine, it is not limited thereto but may be applied to angle-of-rotation detection in machine tools and other machinery and equipment.

While the above description discloses preferred embodiments of the invention, it is to be understood that numerous modifications or alterations may be made without departing from the scope of the invention as set forth in the following claims.

What is claimed is:

1. A method of manufacturing a position sensor for measuring angular position of a rotating shaft, comprising:
   (a) fabricating a hollow tubular member made of a magnetic material;
   (b) disposing a center shaft inside the tubular member coaxially thereto, said tubular member being synchronously rotatable with the rotation of the shaft to be measured through said center shaft;
   (c) placing said tubular member and said shaft disposed therein in a die surrounding both said tubular member and said shaft and injecting resin into said die such that said resin is first directed onto the oter surface of said tubular member so as to exert inward-acting compressive stress on at least a portion of the outer surface of said tubular member;
   (d) injecting resin then into the die such that said resin is directed into the interior of said tubular member between an inner surface of said tubular member and said center shaft to affix said shaft to said tubular member while balancing exerted outward-acting tensile stress with the compressive stress; and
   (e) forming magnetic poles on an outer surface of said tubular member for generating a signal indicative of the angular position in cooperation with a magneto electric transducer means provided on a member positioned independent of rotation.

2. A method as defined in claim 1, wherein said resin is injected onto an upper half portion of the outer surface of said tubular member such that the compressive stress is exerted onto the upper half portion of said tubular member.

3. A method as defined by claim 1, wherein said resin is injected onto an upper half and a portion of a lower half of the outer surface of said tubular member such that the compressive stress is exerted onto the upper half and the portion of the lower half of said tubular member.

4. A method as defined by claim 1, wherein said resin possesses a coefficient of thermal expansion the same as that of said tubular member, said resin containing glass fiber and selected from the group consisting of unsaturated polyester resin, phenol resin, melamine resin, polyester alkyd resin, allelic resin, silicone resin, epoxy resin, polyamide resin and mixtures thereof.

5. A method as defined by claim 1, wherein said resin possesses adhesiveness while keeping its resilience after having been set, said resin selected from the group consisting of: epoxy resin, phenolic novalak epoxy resin, cyclic fatty acid epoxy resin, ortho cresole novolak epoxy resin, polyester alkyl resin, polyamide resin, and mixtures thereof.

6. A method of manufacturing a position sensor for measuring angular position of a rotating shaft, comprising:
   (a) fabricating a hollow tubular member made of a magnetic material having inset portions at an inner surface thereof;
   (b) disposing a center shaft inside said tubular member coaxially thereto, said tubular member being rotatable synchronously with the rotation of the rotating shaft to be measured;
   (c) injecting resin first onto at least a portion of an outer surface of said tubular member so as to exert inward-acting compressive stress thereon;
   (d) injecting resin in said tubular member while balancing exerted outward-acting tensile stress with the compressive stress, said resin filling space formed between an inner surface of said tubular member and the rotating shaft including the inset portions so as to affix said center shaft to said tubular member; and
   (e) forming magnetic poles on the outer surface of said tubular member for generating a signal indicative of the angular position of the rotating shaft to be measured in cooperation with a magneto electric transducer means provided on a member positioned independent of rotation.

7. A method as defined in claim 6, wherein said center shaft disposed in said tubular member at step (b) is provided with a key projecting therefrom and said resin injected in said tubular member at step (d) encircles the center shaft and the key.

8. A method of manufacturing a position sensor for measuring angular position of a rotating shaft, comprising:
(a) fabricating a hollow tubular member made of a magnetic material and positioning the tubular member in a die while disposing a center shaft coaxially to the tubular member, said tubular member being rotatable synchronously with the rotation of the rotating shaft to be measured through said center shaft; said die being shaped and sized so that a passage is formed between a die wall and at least a portion of an outer surface of said tubular member which communicates with an inside of said tubular member;
(b) injecting molten resin in the passage in such a manner that the resin first fills the passage exerting inward-acting compressive stress onto the portion of the outer surface of said tubular member and then flows into the inside of said tubular member, whereby outward-acting tensile stress caused by the resin flowing into said tubular member is balanced by compressive stress,
(c) allowing the resin to cool for a predetermined time; and
(d) forming magnetic poles on the outer surface of said tubular member for generating a signal indicative of the angular position of the rotating shaft to be measured in cooperation with a magneto electric transducer means provided on a member positioned independent of rotation.

9. A method as defined in claim 8, wherein said passage is formed at an upper half of the outer surface of said tubular member.

10. A method as defined by claim 8, wherein said passage is formed around an upper half of the outer surface of said tubular member and said passage extends to a lower half of the outer surface of said tubular member.

11. A member as defined by claim 10, wherein said passage extends to said member lower half at a predetermined interval.

* * * * *